(12) United States Patent
Moy et al.

(10) Patent No.: US 7,862,790 B2
(45) Date of Patent: *Jan. 4, 2011

(54) CARBIDE NANOFIBRILS AND METHOD OF MAKING SAME

(75) Inventors: David Moy, Winchester, MA (US); Chun-Ming Niu, Somerville, MA (US)

(73) Assignee: Hyperion Catalysis Internationl, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/841,493

(22) Filed: Aug. 20, 2007

(65) Prior Publication Data

US 2008/0175782 A1    Jul. 24, 2008

Related U.S. Application Data

(63) Continuation of application No. 11/265,804, filed on Nov. 2, 2005, now Pat. No. 7,393,514, which is a continuation of application No. 10/725,225, filed on Dec. 1, 2003, now abandoned, which is a continuation of application No. 08/414,369, filed on Mar. 31, 1995, now abandoned.

(51) Int. Cl.
   *D01F 9/12* (2006.01)
   *B82B 3/00* (2006.01)

(52) U.S. Cl. .................. 423/291; 423/439; 423/440; 977/734

(58) Field of Classification Search .................. 423/291, 423/439, 440; 977/734
See application file for complete search history.

(56) References Cited

U.S. PATENT DOCUMENTS

| 3,246,950 | A | 4/1966 | Gruber et al. |
|---|---|---|---|
| 4,368,181 | A | 1/1983 | Suzuki et al. |
| 4,481,179 | A | 11/1984 | Wei |
| 4,492,681 | A | 1/1985 | Endou et al. |
| 4,530,825 | A | 7/1985 | Johansson |
| 4,663,230 | A | 5/1987 | Tennent et al. |
| 4,702,901 | A | 10/1987 | Shalek et al. |
| 4,915,924 | A | 4/1990 | Nadkarni et al. |
| 5,116,679 | A | 5/1992 | Sadashiv et al. |
| 5,165,909 | A | 11/1992 | Tennent et al. |
| 5,171,560 | A | 12/1992 | Tennent |
| 5,500,200 | A | 3/1996 | Mandeville et al. |
| 5,707,916 | A | 1/1998 | Snyder et al. |
| 6,203,814 | B1 | 3/2001 | Fisher et al. |
| 6,231,980 | B1 | 5/2001 | Cohen et al. |
| 6,841,508 | B2 | 1/2005 | Moy et al. |

FOREIGN PATENT DOCUMENTS

| EP | 0400656 A1 | 12/1990 |
|---|---|---|
| EP | 0407286 A1 | 1/1991 |
| EP | 0603888 A2 | 6/1994 |
| JP | 63503555 | 12/1988 |
| JP | 01115574 A | 5/1989 |
| JP | 01131251 | 5/1989 |
| JP | 03083900 | 4/1991 |
| JP | 03174018 | 7/1991 |

OTHER PUBLICATIONS

Zhou et al., Production of Silicon Carbide Whiskers from Carbon Nanoclusters' in Chemical Physics Letters, vol. 222, pp. 233-238, May 13, 1994.
NASA Tech Briefs LEW-15415/16, "Making Ceramic Fibers by Chemical Vapor Desposition", pp. 1-8 (1994).
Dai, H., et al., "Synthesis and Characterization of Carbide Nanorods", Nature, vol. 375, pp. 769-772 (Jun. 29, 1995).

*Primary Examiner*—Stuart Hendrickson

(57) ABSTRACT

A plurality of carbide, such as silicon carbide, tungsten carbide, etc., nanofibrils predominantly having diameters substantially less than about 100 nm and a method for making such carbide nanofibrils. The method includes the steps of: heating a plurality of carbon nanotubes or nanofibrils predominantly having diameters less than about 50 nm in a reaction chamber in the presence of a gas of the form $Q_nA_m$, where Q is a metal capable of forming a carbide, A is an element or radical and n and m are integers necessary to satisfy valences, such as, for example silicon monoxide, and an inert gas in a reaction vessel to a temperature substantially less than 1700 C but sufficently high to cause substantial reaction of the metal in the gas with the carbon of said carbon nanotubes or nanofibrils to form, in situ, solid carbide nanofibrils, the temperature being sufficiently low to prevent substantial fusing together of individidual ones of said carbide nanofibrils, removing at least a portion of A-based gas from said reaction chamber as said reaction progresses, and maintaining said temperature until substantially all the carbon of said nanotubes or nanofibrils has been converted into Q-based carbide.

7 Claims, 3 Drawing Sheets

CARBIDE NANOFIBRILS AND METHOD OF MAKING SAME

FIELD OF THE INVENTION

The present invention relates to carbide nanofibrils and a method of making carbide nanofibrils.

BACKGROUND OF THE INVENTION

Ceramics are considered as the materials of future. However, the ceramics are notoriously brittle. The many potential applications of ceramics as high temperature structural materials have been hindered by their lack of toughness and reliability.

In order to improve the toughness and reliability of ceramics, some efforts have been directed towards the development of nanophase ceramics and nanophase ceramic composites. Dramatically different properties can be obtained by making ceramic composites and by making ceramic materials into nanogram structured materials. For examples, the toughness and strength of nanophase $Al_2O_3$-SiC composites are two to five times greater than those of the same materials with conventional structures, and a $Si_3N_4$-SiC nanophase composite can be stretched to two and a half times its original length at 1600° C.

Metallic carbide nanowhiskers, and in particular, silicon carbide (SiC) nanowhiskers (or nanofibrils) are of interest for their potential in the development of supertough ceramics matrix nanocomposites, and the preparation of metal matrix nanocomposites to improve the strength of metals. Potential applications of these nanowhiskers include nanophase carbides, nanophase ceramics, nanophase composites, and abrasive agents for high quality surface finish.

In order to achieve the desirable properties associated with Sic fibrils, or other metallic carbide fibrils, it is important that the fibrils have an extremely small, generally uniform diameter, substantially less than about 100 nm. Heretofore, however, it has not been possible to make Sic or other carbide fibrils in such extremely small dimensions.

SiC whiskers have been prepared by various methods, including hydrogen reduction of $CH_3SiCl_3$, vapor transport of Sic, catalytic reaction of $SiO_2$ and carbon in rice hulls, and vapor-liquid-solid techniques. However, most of the SiC whiskers produced by these methods have poorly crystallized polycrystalline structure. Their diameters are often bigger than 0.5 micrometer.

NASA Tech Briefs LEW-15415/16 describes deposition of Sic onto carbon tow of 5-10 micrometers (basically conventional PAN based fibers) by chemical vapor deposition, principally by use of $CH_3SiCl_3$ and $H_2$ as silicon deposition gas at a temperature of 1250 C. The resultant fibers had cracks and fissures, which were partially eliminated by incorporating the secondary pyrolytic carbon coating over the substrate. This document also includes a cursory account of an attempt to convert conventional carbon fibers (THORNEL M40) by using SiO gas at 1450 C. for 30 minutes. An argon stream with 5-15% CO gas was used as a carrier gas to control the counter diffusion of SiO and CO gas. Moderate and widely varying strength (60-200 KSI) was achieved.

Zhou and Seraphin (Chemical Physics Letters 222 (May 13, 1994) 233-238, describe the preparation of single crystal SiC whiskers by direct reaction of carbon nanoclusters of DC arc generated nanotubes (i.e., clusters of buckytubes) retained on a carbon disc. The length and diameter of the carbon nanotubes ranged from 1-5 micrometer and 20-40 nm, respectively.

The disk containing the nanoclusters was placed on graphitic foil over Sio in a furnace and held at 1700 C., in a flowing argon atmosphere for two hours. The resulting Sic whiskers were about one order of magnitude longer and wider than the initial carbon nanotubes. The SiC whiskers would also continue to grow if the reaction was allowed to proceed.

Although the starting carbon nanotubes had diameters in the range of 20-40 nm, the smallest SiC whisker shown had a diameter greater than 100 nm. The lattice image of the whisker under TEM showed numerous defects.

It is believed that the resulting whiskers were frequently fused to one another at points of intersection. There are no distinguishing macrostructures or properties to relate the macroscopic morphology of the SiC fibers to the starting buckytube sample. Furthermore, the yield of SiC as fibers is low; only a small percentage of the carbon disc starting material (near the surface of the disc) was converted to SiC. Of the carbon material converted, a substantial amount is in the form of non-fibrous, amorphous particles or clumps.

Accordingly, although some attempts have been made to synthesize silicon carbide fibers and nanofibers, the prior efforts have not been successful in synthesizing high and consistent quality silicon carbide, or other carbide, nanofibrils predominantly in diameters substantially smaller than 100 nm.

OBJECTS OF THE PRESENT INVENTION

It is an object of the present invention to provide a plurality of metal carbide nanofibrils predominantly having diameters of less than about 100 nm.

It is a further object of the present invention to provide such nanofibrils which are of high quality and generally uniform diameter.

It is a further object of the present invention to provide such metal carbide nanofibrils which are substantially unfused to one another.

It is a further object of the present invention to provide such metal carbide nanofibrils which are silicon carbide.

It is an object of the present invention to provide a method of making a plurality of carbide nanofibrils predominantly having diameters substantially less than about 100 nm, in situ, from carbon nanotubes or nanofibrils.

It is a further object of the present invention to provide a method of making such carbide nanofibrils from carbon nanotubes or nanofibrils which may be performed at relatively low temperatures.

It is a further object of the present invention to provide such a method for making silicon carbide nanofibrils.

It is a further object of the present invention to provide an abrasive having a plurality of Q-based carbide nanofibrils predominantly having diameters substantially less than about 100 nm, where Q is any metal capable of forming a carbide.

It is a further object of the present invention to provide a nanophase high temperature, high strength composite material having a high temperature, high strength metallic base material reinforced with a plurality of Q-based carbide nanofibrils predominantly having diameters substantially less than about 100 nm, where Q is any metal capable of forming a carbide.

It is a further object of the present invention to provide a nanophase high temperature, high strength ceramic material having a plurality of Q-based carbide nanofibrils predominantly having diameters substantially less than about 100 nm, where Q is any metal capable of forming a carbide.

SUMMARY OF THE INVENTION

In accordance with a preferred embodiment of the present invention, a plurality of Q-based carbide nanofibrils predominantly having diameters substantially less than about 100 nm are provided, where Q is any metal capable of forming a carbide.

In accordance with another preferred embodiment of the present invention, a method of making a plurality of Q-based carbide nanofibrils predominantly having diameters substantially less than about 100 nm is provided, comprising the steps of: heating a plurality of carbon nanotubes or nanofibrils predominantly having diameters less than about 50 nm in a reaction chamber in the presence of a Q-based gas of the form $Q_nA_m$, where A is an element or radical and n and m are integers necessary to satisfy valences, and an inert gas in a reaction vessel to a temperature substantially less than 1700 C. but sufficently high to cause substantial reaction of said Q-based gas with the carbon of said carbon nanotubes or nanofibrils to form, in situ, solid Q-based carbide nanofibrils and an A-based gas, said temperature being sufficiently low to prevent substantial fusing together of individidual ones of said carbide nanofibrils, removing at least a portion of said A-based gas from said reaction chamber as said reaction progresses, and maintaining said temperature until substantially all the carbon of said nanotubes or nanofibrils has been converted into Q-based carbide.

In accordance with another preferred embodiment of the present invention, an abrasive is provided, comprising a plurality of Q-based carbide nanofibrils predominantly having diameters substantially less than about 100 nm, where Q is any metal capable of forming a carbide.

In accordance with another preferred embodiment of the present invention, a nanophase high temperature, high strength composite material is provided, comprising a high temperature, high strength metallic base material reinforced with a plurality of Q-based carbide nanofibrils predominantly having diameters substantially less than about 100 nm, where Q is any metal capable of forming a carbide.

In accordance with another preferred embodiment of the present invention, a nanophase high temperature, high strength ceramic material is provided, comprising a plurality of Q-based carbide nanofibrils predominantly having diameters substantially less than about 100 nm, where Q is any metal capable of forming a carbide.

BRIEF DESCRIPTION OF THE DRAWINGS

These and other objects, features and advantages of the present invention will become clear to those skilled in the art upon review of the following description and figures, wherein.

DETAILED DESCRIPTION

Figure 1:
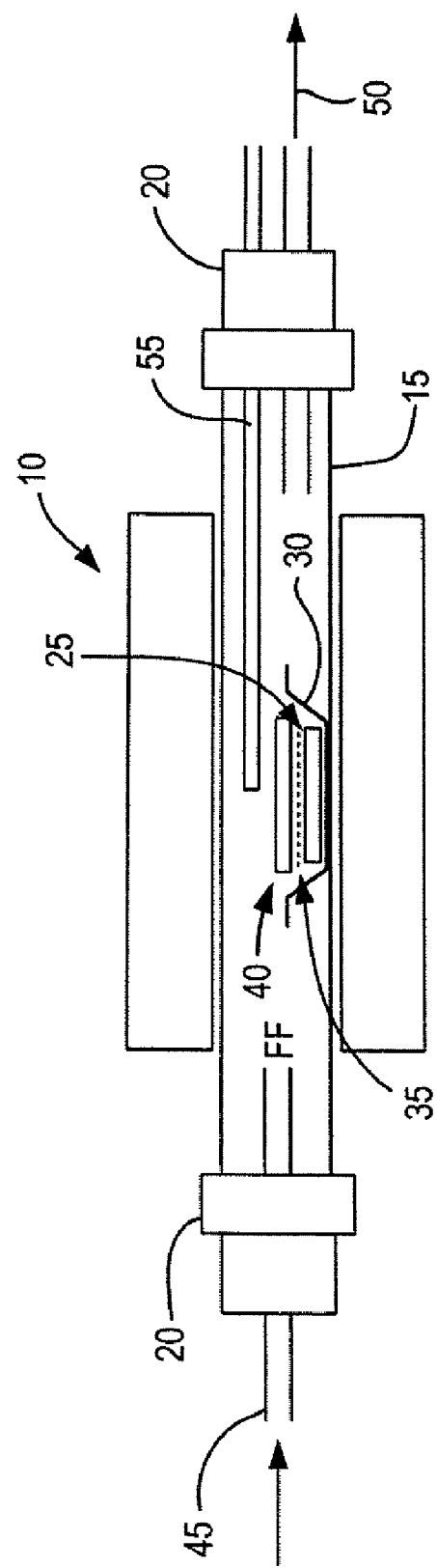
FIG. 1 is a schematic depiction of an illustrative reaction furnace for making carbide nanofibrils in accordance with a preferred embodiment of the present invention.

The present inventors have succeeded in producing a plurality of Sic fibrils predominantly having generally uniform diameters substantially less than 100 nm from a plurality of carbon nanofibrils or nanotubes having dimensions of about 50 nm or less by reaction with SiO gas at a relatively low temperature, sufficently high to cause reaction of said Q-based gas with the carbon of said nanofibrils to form, in situ, solid SiC, but sufficiently low to prevent substantial fusing together of individual ones of said nanofibrils. This temperature is substantially less than 1700 C., and preferably in the range of about 1000 C. to about 1400 C., most preferably approximately 1200 C.

The reaction appears to be a pseudo-topotactic transformation because the SiC nanofibrils produced inherited certain macroscopic morphological features of the starting carbon nanotubes or nanofibrils. The resulting SiC nanofibrils appear to remain separate and predominantly unfused to other nanofibrils. The structure of individual nanofibrils appears to be single crystal Beta SiC. The diameters of the resulting SiC nanofibrils is about double that of the starting carbon nanofibrils or nanotubes (~10-20 nm).

Example 1 a. Carbon Source

The carbon nanotubes used in this synthesis were BN ("bird's nest") and CC ("cotton candy") fibrils (Hyperion Catalysis). These carbon fibrils are produced by catalytic decomposition of carbon-based gas, such as hydrocarbon gas, and are characterized by substantially uniform diameters between about 7-12 nm, multiple graphitic carbon layers arranged concentrically around the tube axis, a hollow core and aspect ratios of about 10-500.

The foregoing nanotubes or nanofibrils are grown in aggregates having a macroscopic morphology of either bundles of relatively straight tubules or approximately spherical aggregates of highly intertwining, curved tubules resembling bird nests ("BN"), cotton candy ("CC"), or combinations of these. The individual tubules in any aggregate have a relatively narrow diameter distribution, the great majority being in the range of 7-9 nm for bundles, 8-12 nm for BN). In either aggregate morphology, essentially all the carbon is in the form of nanotubes. The inter-tubule distances in the aggregates are large, up to 100 nm (aggregates contain over 95% void volumes). These fibrils are generally free of a thermal carbon overcoat. Such fibrils and the manner of making them are described, for example, in U.S. patent application Ser. No. 08/352,400, filed Dec. 8, 1994, U.S. patent application Ser. No. 149,573, filed Jan. 28, 1988, U.S. Pat. No. 4,663,230, and U.S. Pat. No. 5,171,560, all of which are owned by the same assignee as the present invention. The contents of these applications and patents are incorporated herein by reference.

Although these starting carbon fibrils are preferred, other carbon nanotubes, such as carbon arc grown nanotubes and other carbon nanofibrils having diameters in the same general range, and up to about 50 nm, may also be employed, although with generally less satisfactory results.

b. Procedure

Silicon monoxide (Johnson Matthey) was used as a silicon source. As showed in FIG. 1, the apparatus for the reaction consists of a tubular resistance furnace 10 comprising a quartz tube 15 with the end caps 20. 200 mg SiO 25 was placed in an alumina boat 30 and covered with quartz wool 35. 50 mg of carbon fibrils 40 were positioned on top of the quartz wool 35.

The furnace 10 was purged with argon through inlet tube 45 and out outlet tube 50 in the direction indicated by the arrows for 30 min., then heated up to 1200 C. by means of heater 55. This temperature was maintained for 18 hours. The furnace 10 was then turned off, and cooled down to room temperature. The Ar flow rate during the reaction was: 60 cm³/min.

The chemical reaction can be formulated as:

$$2C(s)+SiO(g)=SiC(s)+CO(g)$$

In the furnace at the operating temperature, the SiO was vaporized into SiO gas and the SiO gas then reacted with carbon nanotubes to form SiC and CO. Subsequently, the CO gas was removed from the system by Ar carrier gas.

c. Results

After the reaction with SiO, the black color of the fibrils was changed to light greenish. The greenish color indicated the formation of SiC. Essentially the entire mass of starting carbon nanotubes was converted into SiC.

The macroscopic morphologies of the products were examined with SEM. SEM photos revealed that the products inherited certain morphological features of the starting carbon fibrils. The microscopic morphology of the products was characterized with TEM and select area electron diffraction.

Figure 2A:
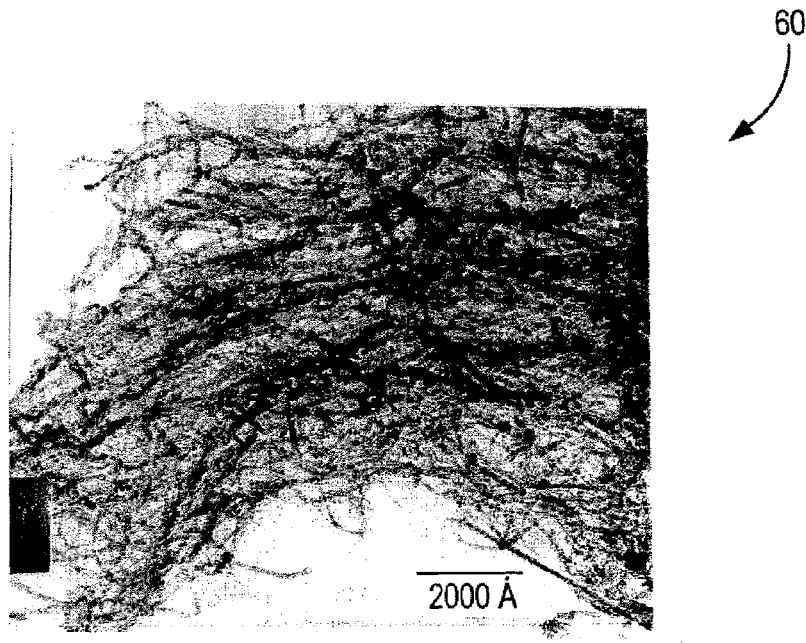
FIG. 2A is a TEM photomicrograph of a mass of Sic nanofibrils in accordance with a preferred embodiment of the present invention, converted from carbon nanotubes catalytically made from a carbon-based gas.
Figure 3A:
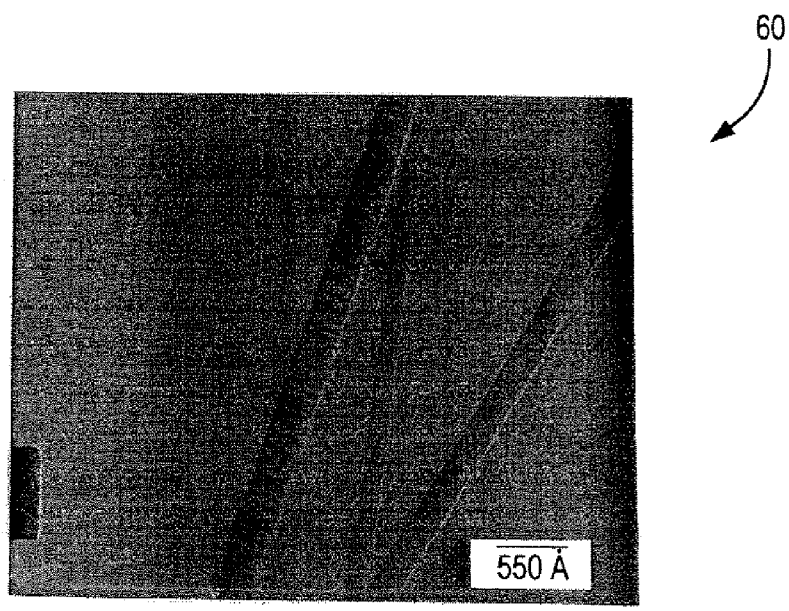
FIG. 3A is a TEM photomicrograph of single crystal Sic nanofibrils converted from carbon nanotubes catalytically made from a carbon-based gas.

As shown in FIGS. 2A and 3A, the TEM photos revealed that the tubular carbon nanotubes have been converted into solid SiC nanofibrils 60. The diameters of these nanofibrils are predominantly in the range of 10-20 nm and generally uniform for each of the nanofibrils (i.e., the diameter is generally uniform along the length of each shaft). Both X-ray and diffraction studies showed the SiC nanofibrils were crystallized with Beta SiC structure. Furthermore, the select area electron diffraction from single nanofibrils indicated that these nanofibrils are single crystal. However, polycrystalline forms are also expressly contemplated by the present invention.

Although the mechanism of reaction is not clear, it appears to be that the reaction of carbon nanotubes with siO vapor is a pseudo-topotactic transformation because the process conserved the external structure, i.e., the kinky, somewhat intertwined macroscopic morphology of the carbon nanotubes. The typical diameters of the SiC nanowhiskers are about 20 nm, which are about twice the typical diameters of the starting carbon nanotubes. However, the SiC nanowhiskers may be as small as 5 nm.

From the Hyperion Catalysis carbon nanotubes, essentially only SiC nanofibrils with diameters ranging from 5-100 nm are obtained. Substantially all of carbon of the starting carbon nanotubes or nanofibrils is converted to SiC and substantially all of this is in the form of nanofibrils. The approximate distributions are:

| Diameter, nm | % |
|---|---|
| 5-20 | 90 |
| 20-50 | 9 |
| 50-100 | 1 |

A few large diameter (>100 nm) fibers with catalyst particles associated with them are also evident. However, these represent less than 1% of the total product. Substantially all of the mass of SiC recovered is in the form of nanofibrils.

Figure 2B:
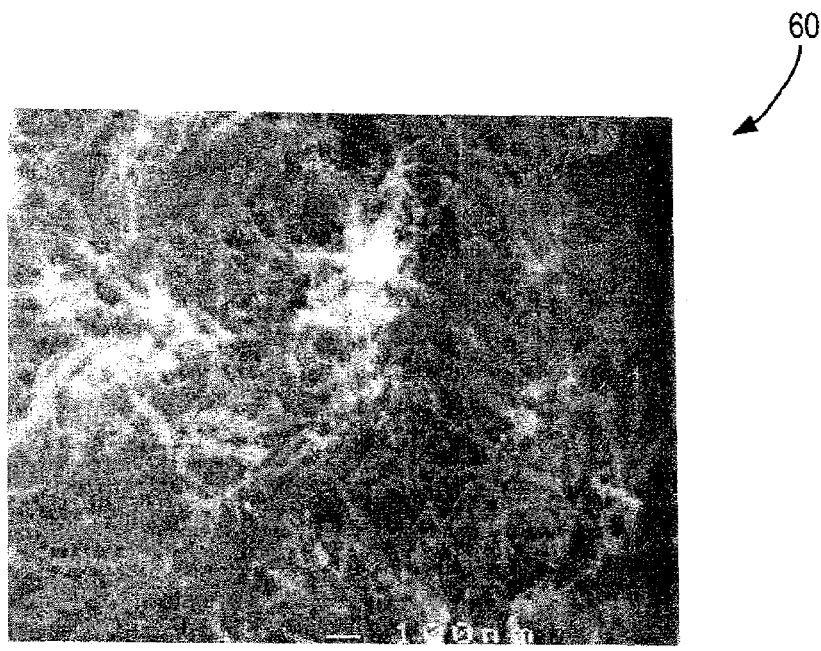
FIG. 2B is a SEM photomicrograph of SiC nanofibrils in accordance with a preferred embodiment of the present invention, converted from carbon nanotubes catalytically made from a carbon-based gas.

As can be seen in FIGS. 2A and 2B, the SiC fibers are mostly present in aggregate form as kinky, somewhat intertwined individual fibers similar to the morphology of the carbon nanotubes which spawned them. The SiC fibers have slightly larger diameters than the starting carbon nanotubes, but not sufficiently larger to indicate growth by interfiber diffusion of Sic or by VLS. The similarity of the morphology of the individual SiC fibers to the initial carbon nanotubes indicates topotactic growth. Because the exact mechanism is not known with certainty, this is referred to herein as pseudo-topotactic.

Example 2 a. Carbon Source

A second example was conducted using a sample of buckytubes (core) purchased from MER Corp.

b. Procedure

The procedure and temperatures were the same as described above in Example 1.

c. Results

Figure 3B:
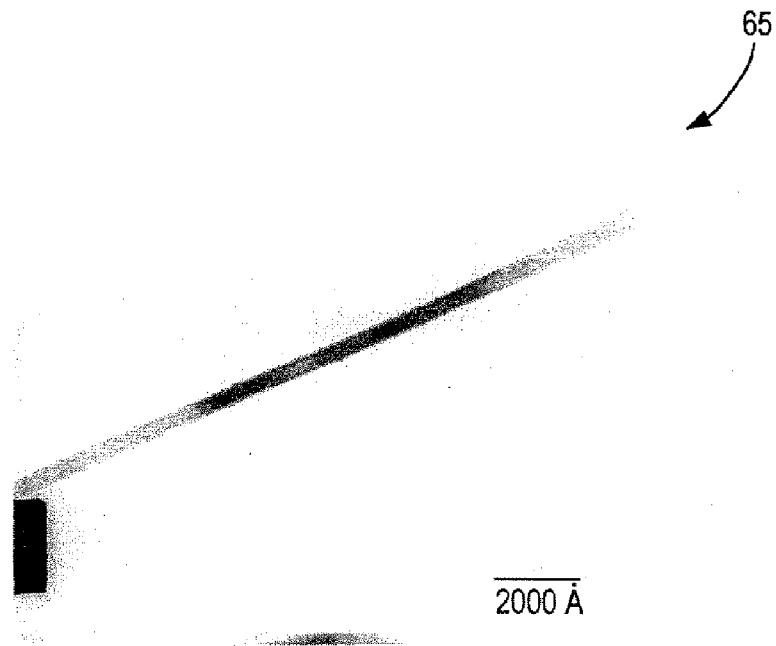
FIG. 3B is a TEM photomicrograph of a single Sic nanofibril converted from a buckytube, at a temperature of approximately 1200 C.

The distinguishing features of products from this example are: 1) even though there are some small diameter Sic nanofibrils present (one of which is shown in FIG. 3B as 65), these small nanofibrils represent a minor percentage of the total nanofibrils, and the diameter distribution is large, ranging from ~50 nm to several hundred nm; 2) there are no distinguishing macrostructures or properties to relate the morphology of the sic fibers to the morphology of the starting buckytube sample; and 3) the yield of SiC as nanofibrils, as compared to the amount produced as other, non-fibrous shapes and structures is low.

The differences between the products described in the Zhou et al. article (using buckytubes at high temperature) and the present invention using either buckytubes or nanotubes indicates that topotactic growth, characteristic of the present invention, occurs only at temperatures substantially lower than 1700 C. (i.e, in the range of about 1000 to 1400 C. vs 1700 C.). At the higher temperature (i.e., approximately the 1700 C. temperature of the Zhou et al. article), the fibers would be much thicker as a result of interfiber diffusion or sintering.

The generally uniform and very small size carbide nanofibrils in accordance with the present invention are useful for forming extremely fine abrasives, nanophase ceramics, nanophase ceramic composites, and as reinforcement in metal matrix nanocomposites using a high temperature, high strength metallic base material, particularly for high temperature, high strength applications such as gas turbine blades.

Other silicon source gases and combinations of gases may also be used besides the SiO source employed in the examples above. For example, a mixture of $SiO_2$ and Si at a temperature of 1000 C. to about 1400 C. may also be used. As another example, Si and $H_2$ at about 1200 ° C. may be used. Other exemplary source gases include the following: $SiH_xCl_{(4-x)}$, where x=integer; $SiR_xY_{(4-x)}$, where x=integer, and R=alkyl, aryl, etc., Y=H or Cl; $Si(ZR)_xA_{(4-x)}$, where x=integer, A=R or Cl, R=alkyl, aryl, etc., and Z=O, N. Of course, these are only examples of silicon source gases and there is no intention of limiting the invention to these examples alone.

The pseudo-topotactic transformation of carbon nanofibrils to carbide nanofibrils in accordance with the present invention can also be accomplished with other metals which are capable of forming carbides. In this regard, boron, titanium, tantalum, niobium, zirconium, halfnium, molybdenum and tungsten, among others, are cabable of forming carbides. The method of making carbides from these metals would be similar to the method for making Sic described in the example above, i.e., the carbon fibrils are contacted with a gas based on the metal at a temperature substantially less than 1700 C., preferrably between about 1000 C. and 1400 C., and most preferrably around 1200 C.

Although the invention has been described herein in accordance with a preferred embodiment thereof, there is no intention of limiting the scope of the invention solely to the preferred embodiment described. Rather, the scope of the invention is to be measured by the appended claims.

We claim:

1. A method of making a plurality of Q-based carbide nanofibrils predominantly having diameters substantially less than about 100 nm, comprising the steps of:

heating a plurality of carbon nanotubes or nanofibrils predominantly having diameters less than about 50 nm in a reaction chamber in the presence of a Q-based gas of the form $Q_n A_m$, where A is an element or radical, Q is an element selected from the group consisting of boron, titanium, tantalum, niobium, zirconium, halfnium, molybdenum and tungsten, and n and m are integers necessary to satisfy valences, and an inert gas in a reaction vessel to a temperature substantially less than 1700° C. but sufficiently high to cause substantial reaction of said Q-based gas with the carbon of said carbon nanotubes or nanofibrils to form, in situ, solid Q-based carbide nanofibrils and a A-based gas, said temperature being sufficiently low to prevent substantial fusing together of individual ones of said carbide nanofibrils, removing at least a portion of said A-based gas from said reaction chamber as said reaction progresses, and maintaining said temperature until substantially all the carbon of said nanotubes or nanofibrils has been converted into Q-based carbide nanofibrils wherein the increased diameter of said carbide nanofibrils is no more than about double that of the carbon nanotubes or nanofibrils from which they were made.

2. The method defined in claim 1, wherein said temperature is between about 1000° C. and about 1400° C.

3. The method defined in claim 1, wherein said carbide nanofibrils predominantly have diameters in the range of about 5-50 nm.

4. The method defined in claim 1, wherein said carbide nanofibrils predominantly have diameters in the range of about 5-20 nm.

5. The method defined in claim 1, wherein said carbide nanofibrils are predominantly each a single crystal.

6. The method defined in claim 5, wherein said single crystal has a Beta crystal structure.

7. The method defined in claim 1, wherein said carbide nanofibrils are polycrystalline.

* * * * *